United States Patent [19]

Khosrovi et al.

[11] Patent Number: 4,831,594

[45] Date of Patent: May 16, 1989

[54] PROCESS AND DEVICE FOR REFRESHING AN ARRAY OF DYNAMIC MEMORY CELLS DURING PRECHARGE OF THE COLUMN LINES

[75] Inventors: Aman Khosrovi, Houston, Tex.; Perry W. Lou, Carlsbad, Calif.; Ki S. Chang, Houston, Tex.

[73] Assignee: Texas Instrument, Inc., Dallas, Tex.

[21] Appl. No.: 911,289

[22] Filed: Sep. 25, 1986

[51] Int. Cl.[4] ............................................. G11C 7/00
[52] U.S. Cl. .................................... 365/222; 365/203; 365/190
[58] Field of Search ............... 365/222, 203, 233, 189, 365/190

[56] References Cited

U.S. PATENT DOCUMENTS

| | | | |
|---|---|---|---|
| 3,737,879 | 6/1973 | Greene et al. | 365/203 X |
| 4,044,341 | 8/1977 | Stewart et al. | 365/203 X |
| 4,106,108 | 8/1978 | Cislaghi et al. | 365/222 X |
| 4,112,513 | 9/1978 | Elsner | 365/222 X |
| 4,207,618 | 6/1980 | White, Jr. et al. | 365/222 |
| 4,333,167 | 6/1982 | McElroy | 365/222 |
| 4,344,157 | 8/1982 | White, Jr. et al. | 365/222 |
| 4,494,222 | 1/1985 | White et al. | 365/222 |
| 4,653,030 | 3/1987 | Tachibana et al. | 365/222 |

FOREIGN PATENT DOCUMENTS 54-121630 9/1979 Japan .

OTHER PUBLICATIONS

NEC Electronics Inc., Jan. 1985, "µPD41264 262, 144-Bit Dual Port Dynamic NMOS RAM".

Primary Examiner—Stuart N. Hecker
Assistant Examiner—Alfonso Garcia
Attorney, Agent, or Firm—Melvin Sharp; Lawrence J. Bassuk; Richard Bachand

[57] ABSTRACT

The device refreshes the cells of an array of dynamic memory cells a row at a time during precharging of the bit or column lines. Normal access to read or write to the cells also refreshes them. Refresh circuits connect to the row line between the row address decoder and the cells, and include shift register stages connected to the row lines. A bit of one sense shifting through the stages indicates the row to be refreshed and a refresh signal connected to the stages times the refresh during the precharge. Using multiple, sequential refresh signals refreshes alternating rows of the cells.

46 Claims, 4 Drawing Sheets

PROCESS AND DEVICE FOR REFRESHING AN ARRAY OF DYNAMIC MEMORY CELLS DURING PRECHARGE OF THE COLUMN LINES

BACKGROUND

The present invention relates to a cyclic refresh scheme for refreshing the charge or electrical signal, which has been lost due to leakage, stored on an array of dynamic memory cells.

A common approach to refreshing the charge, which has been diminished as a result of leakage through transistors, stored in a dynamic memory cell has been to interrupt the normal processor machine cycles every preselected number of cycles and to recharge the cells one row at a time. In the case of dynamic rams such refreshing of the stored charge must occur within an interval or a maximum time of about 100 microseconds to avoid excessive loss of charge. If, for example, one wishes to refresh every 16 machine cycles and an average frequency of 2 MHz is used for the processor machine, then for even a modest number of rows such as 128, the time between refresh is about 1 millisecond. Moreover, even if the latter time were acceptable, which it is not, the system deadtime introduced in order to carry out the refresh operation is not desirable.

Accordingly, it is an object of the present invention to provide an improved method of refreshing the stored charge on a dynamic memory cell. It is a further object of the invention to provide a method of refreshing the stored charge on a dynamic memory cell which does not interrupt the normal machine operation.

SUMMARY OF THE INVENTION

The invention provides a method of refreshing the charge on an array of dynamic memory cells that includes refreshing the charge on a row of cells during precharging of the bit lines. Since the address lines are not being used during precharge, it is possible to apply a refresh access pulse to the row being refreshed during a precharge and to step through a row once each machine cycle.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
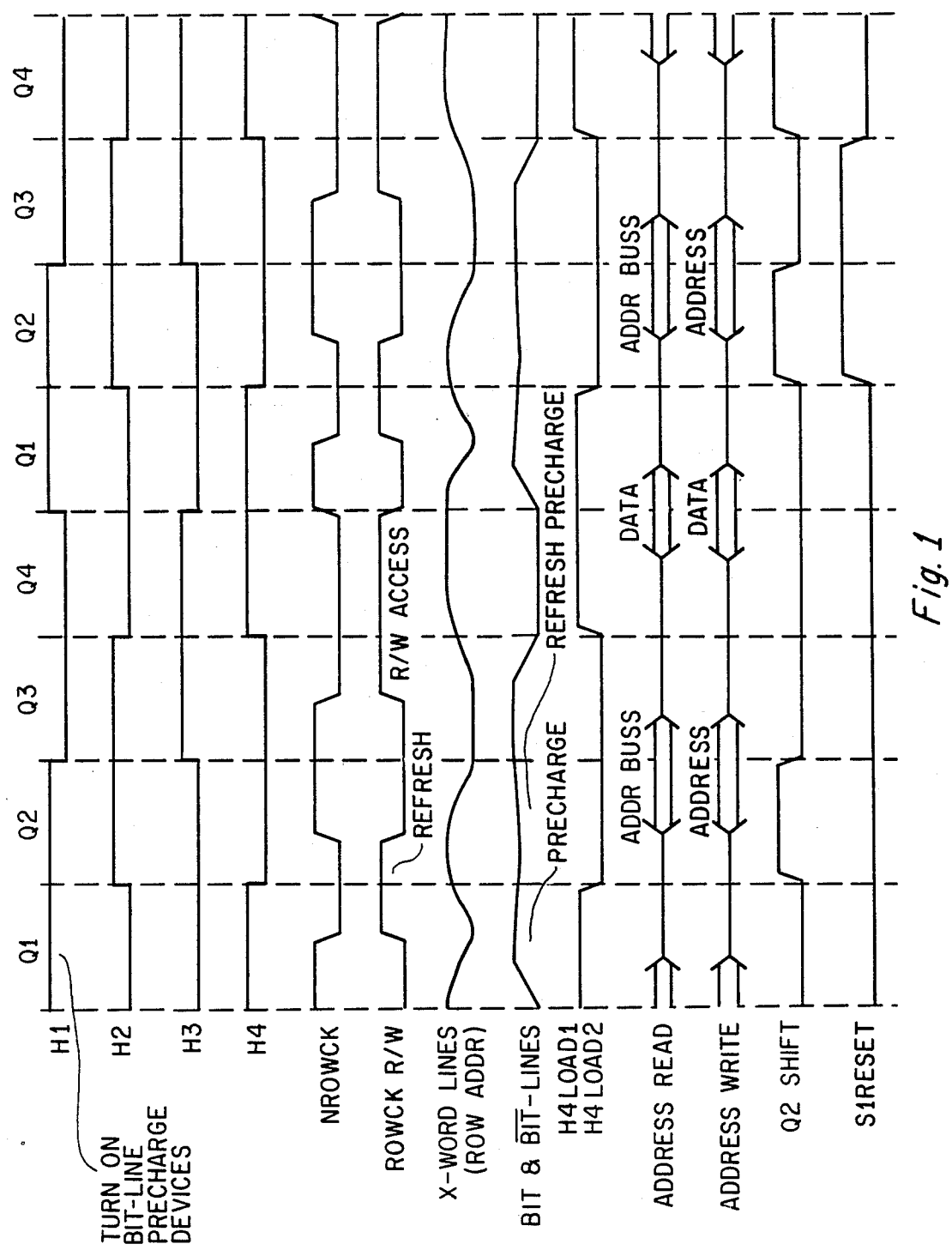
FIG. 1 is a diagram showing the waveforms of various control signals used in and with the method of the invention.

In FIG. 1, a series of clock waveforms occur each processor or cycle and two machine cycles stand represented. Each machine cycle is split into 4 separate phase portions Q1, Q2, Q3, and Q4. Clock signals H1, H2, H3, and H4, respectively, start at each of the phase portions and last two whole phase portions.

The memory cell precharge ordinarily occurs during the first portion of the machine cycle, in this case during Q1, Q2, and part of Q3 as indicated by the BIT & BIT LINES waveform. In the case of either a read or write operation the ADDRESS READ and ADDRESS WRITE signals indicate that address of the cell to be addressed is placed on the address bus midway through Q2 and stays there until about midway through Q3. A row line signal ROWCK for a read or write access operation normally goes high during Q3 and lasts through Q4. As can be seen in the X-WORD LINES waveform the ROWK signal experiences a long RC charge and discharge time due to the large capacitance of the row line. The ADDRESS READ and ADDRESS WRITE signals indicate placing data on the data bus midway through Q4 and until about midway through Q1.

The present invention furnishes a pair of load refresh address signals H4LOAD1 and H4LOAD2 shown as one waveform that occur on alternate passes through each of an odd and even set of 64 rows of a 128 row array. These signals in combination with a signal from a shift register (to be described later with respect to FIG. 2) are for the purpose of selecting the row to be refreshed. An additional pulse in the ROWCK signal that starts about midway into Q1 and lasts until about midway into Q2 corresponds to the refresh access or refresh selection signal that turns on the cell row line pass transistors coupled to the column or bit lines.

The signals H4 (H4LOAD1 and H4LOAD2) and Q2SHIFT are used to advance sequentially through the 64 bit shift register on alternate H4 and Q2SHIFT signals.

Precharging of the bit lines starts during Q1 and continues through to the end of Q2. However, the charge level on the bit lines stays high until the end of Q3 when it is discharged by the read or write operation.

Figure 2:
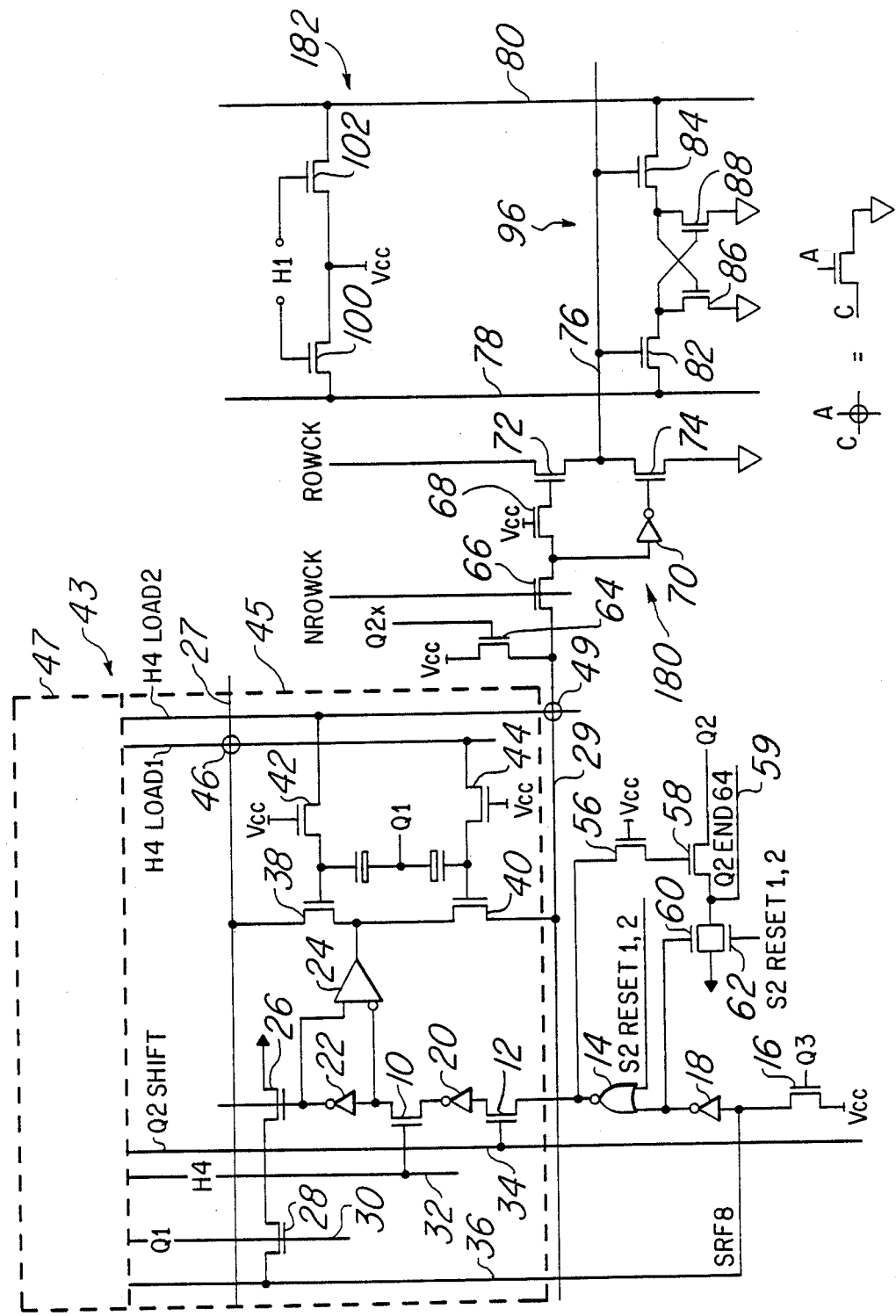
FIG. 2 is a circuit diagram of the logic used to implement the refresh operation of the invention.
Figure 5:
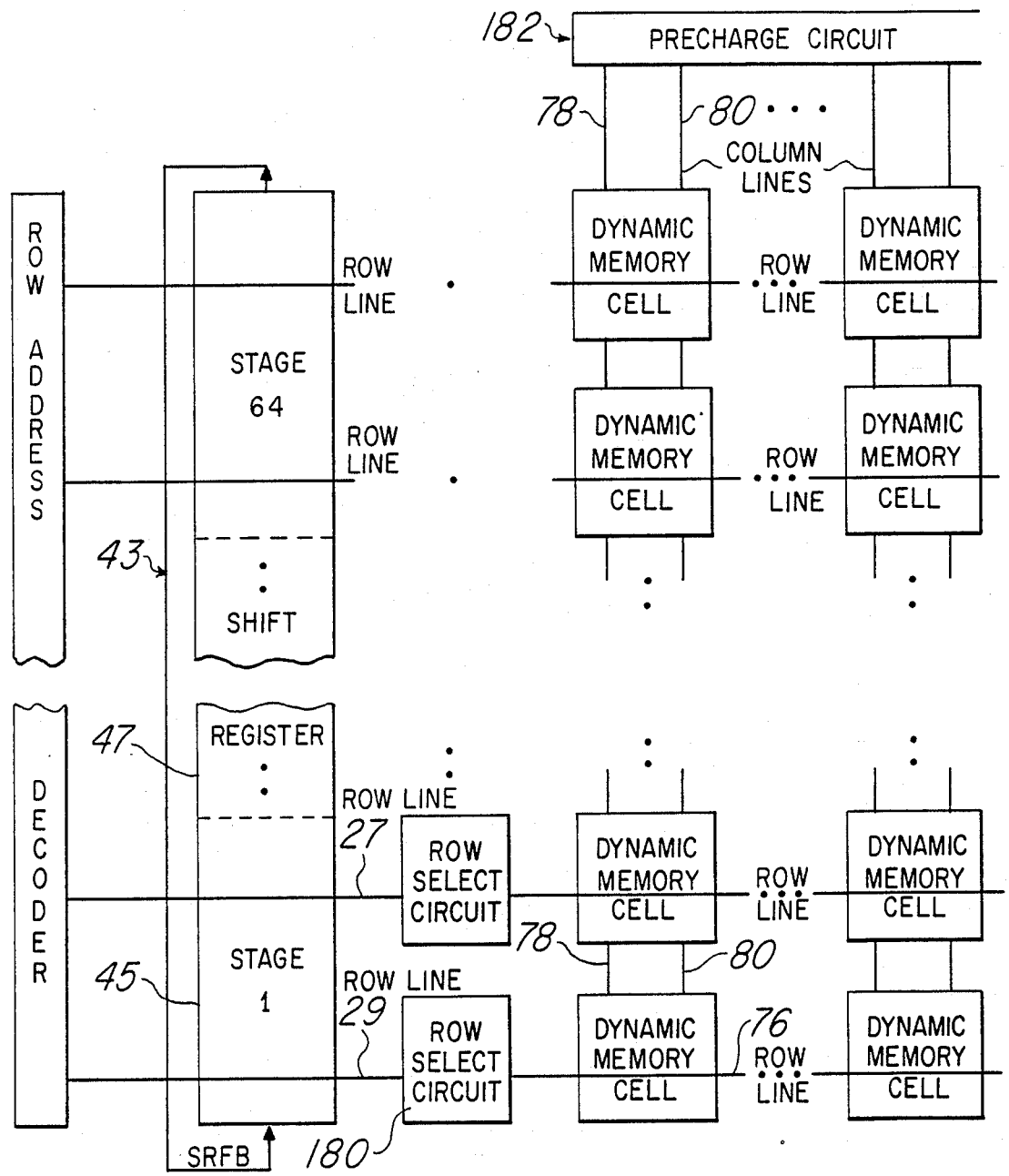
FIG. 5 is a schematic block diagram of an arrangement of shift register stages with an array of dynamic memory cells according to the invention.

The logic circuit used to generate these signals and apply them to an array of dynamic memory cells as shown in FIG. 2 and FIG. 5 includes an array of row lines 76 only one of which is shown in FIG. 2 and an array of complementary column lines 78 and 80 only one set of which is shown in FIG. 2. In this case a dynamic memory cell 96 is connected between selected intersections of the pair of column lines 78 and 80 and the row line 76. Each cell 96 is made up of 4 transistors 82, 84, 86 and 88 with transistors 86 and 88 connected together to form a cross coupled latch, and column access control by column signals 78 and 80 being provided by transistors 82 and 84, respectively, whose gates are connected to row line 76. A precharging circuit 182 consists of transistors 100 and 102 which are gated on by signal H1 and couple $V_{cc}$ to column lines 78 and 80, respectively. The rows 76 are accessed in a sequential manner as determined by a shift register 43 having 64 refresh address stages 47 identical to the first stage 45. Each stage of shift register 43 has two bit positions made up of two inverters 20 and 22 access to which is controlled by pass gates 12 and 10, respectively. The gate of pass gate 12 is connected to Q2SHIFT line 34 while that of pass gate 10 is connected to H4 line 32. The bit value stored in the first stage 45 of shift register 43 is sampled by driver 24 and outputted to a common source connection of transistors 38 and 40. The gates of transistors 38 and 40 are connected to row lines 27 and 29 while pass gates 42 and 44 are gated on by Vcc.

At the output of each stage of shift register 43 there are two series connected transistors 26 and 28 whose gates are triggered by the output of inverter 22 and by Q1, respectively. The other end of the source to drain path of transistor 28 is connected to SRFB line 36.

The circuitry at the input to the shift register 43 consists of an inverter 18 whose output goes to one input of a NOR gate 14. The other input of the NOR gate 14 goes to S2RESET 1,2 line. At the output of NOR gate 14 there is connected one end of the source to drain path of transistor 56 gated on by Vcc. The other end is used to gate transistor 58 whose source to drain path couples Q2 and Q2END64 line 59. The source to drain paths of both transistors 60 and 62 connect line 59 to ground. Transistor 60 is gated by the output of inverter 18 while that of transistor 62 is gated by S2RESET1,2. SRFB line 36 is coupled to the input of inverter 18 and also to one end of a source to drain path of transistor 16 whose other end connects to $V_{cc}$. Transistor 16 is gated on by Q3 at which time it precharges the SRFB line 36 to $V_{cc}$.

The row select circuitry 180 for controlling the selection of the rows of cells to be refreshed includes a gated clock consisting of transistors 72 and 74 connected between ROWCK line and ground with the junction of the source and drain of transistors 72 and 74 used to drive row line 76. The voltage on line 29 is gated by NROWCK applied to the gate of transistor 66 into both the inverter 70 at the gate of transistor 74 and through transistor 68 to the gate of transistor 72. With the voltage on line 76 raised by the application of ROWCK, transistors 82 and 84 are both conducting. With both odd and even bit lines 78 and 80, respectively, precharged and assuming a logic "0" is stored at the node or drain of transistor 88 so that it is conducting and a logic "1" at the node or drain of transistor 86 so that transistor 86 is off, then bit line 80 will discharge through transistor 88 to a voltage below the precharge voltage while the charge at the node of transistor 86 will be refreshed. A sense amplifier coupled to the bit lines 78 and 80 will sense the imbalance of voltage on the latter bit lines and hence sense the state of memory.

In order to block access to a row in a given bit location not being accessed, N-channel pull down blocking gate transistors 46 and 49 are provided. When refresh signal H4LOAD1, for example, is high line 27 will be pulled down to ground. A high H4LOAD1 will turn on transistor 40 and gate the output of non-inverting push-pull driver 24 to line 29. Similarly, when refresh signal H4LOAD2 is high line 29 will be pulled down to ground and transistor 38 will be on, gating driver 24 to line 27. If it is assumed that H4LOAD1 is high then transistor 40 will be conducting to gate the output of non-inverting push pull driver 24 to line 29. These transistors form a gating circuit. This output passes through pass transistor 66 on NROWCK to the gate of transistor 72 and, after inversion by inverter 70, to the gate of transistor 74. A high output from driver 24 will thus turn on transistor 72 and transmit ROWCK onto line 76. With cell 96 selected by the high signal on line 76, the precharge voltage placed on bit lines 78 and 80 will refresh cell 96.

Operationally, on Q3 of each cycle Vcc is placed on SRFB line 36 by transistor 16. If a low logic "0" is stored in each stage of shift register 43 then transistor 26 will be non-conducting during Q1 and line SRFB will remain high. This results in a low output of inverter 18 which cuts off transistor 60. Assume also that S2REST1,2 is low so that the output of NOR gate 14 is high. The high signal passes through transistor 56 to the gate of transistor 58 gating the latter on and placing Q2 onto Q2END64 line 59. Meanwhile, on Q2SHIFT which occurs during Q2, transistor 12 passes the logic one (high) signal through inverter 20. On the next H4 signal the logic zero at the output of inverter 20 is gated past transistor 10 and through inverter 22 and appears at the gate of transistor 26 as a logic one gating on the latter. The logic one is also sensed by the non-inverting driver 24 whose output is the same as that of inverter 22. Thus, a high level or logic "1" at the output of inverter 22 when placed onto line 29 results in the refresh of cell 96 while a low or logic "0" level results in the conduction of transistor 74 which grounds line 76 and cuts off transistors 82 and 84.

Once the logic "1" has passed through the first stage 45 of shift register 43 it passes on to the second stage and subsequently during Q1 and Q2 of the next clock cycle causes the refresh of one of rows 27 or 29 of that stage. The logic "1" in the second stage also causes SRFB line 36 to be grounded during Q1 by turning on transistor 26 and causes a logic "0" or low signal to be put into the first stage 45. During each cycle SRFB line 36 is precharged to $V_{cc}$ by transistor 16 and discharged during Q1 of the next clock cycle as long as the logic "1" is in the shift register 43. During each shift of the logic "1" to a next stage a logic "0" is fed into the first stage 45.

Figure 4:
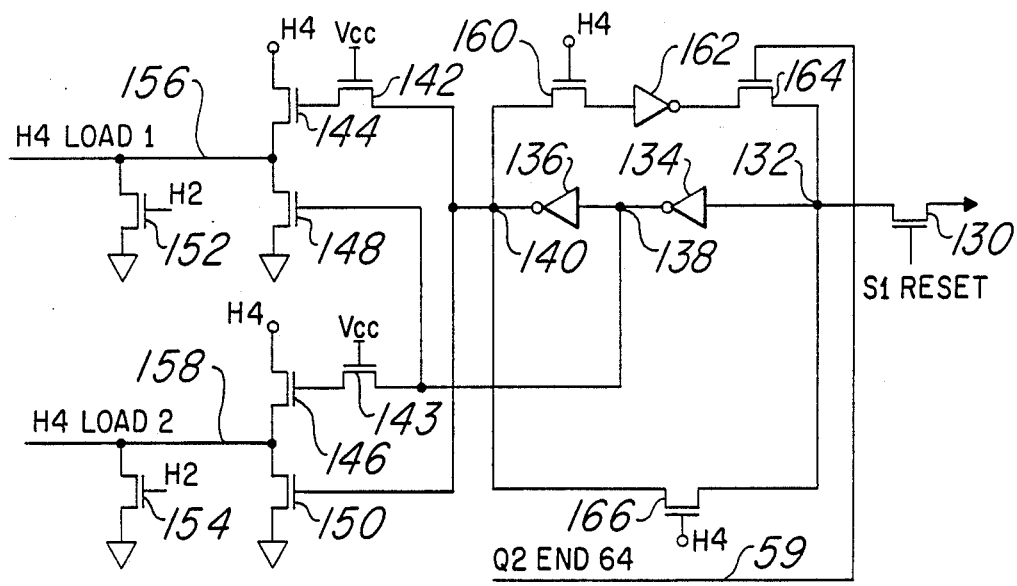
FIG. 4 is a circuit diagram of the circuit used to generate the refresh signal H4LOAD1 and H4LOAD2 that control which of two row lines in a given shift register position are being charged.

Once a zero reaches the last bit position (during Q4 of refresh of the last stage) on Q1 of the next clock cycle SRFB line 36 is left high putting a logic "0" into one input of NOR gate 14. As S2RESET1,2 is low a logic "1" is again fed into the first stage 45 while transistor 58 conducts and passes Q2 onto Q2END64 line 59. Referring to FIG. 4 Q2END64 being high turns on pass transistor 164 and inverts the signal on node 132. This switches the output from one of H4LOAD1 and H4LOAD2 to the other. Thus, on the second pass of the logic "1" through each stage of the shift register 43, the line of lines 27 and 29 not selected on the first pass will be selected.

Figure 3:
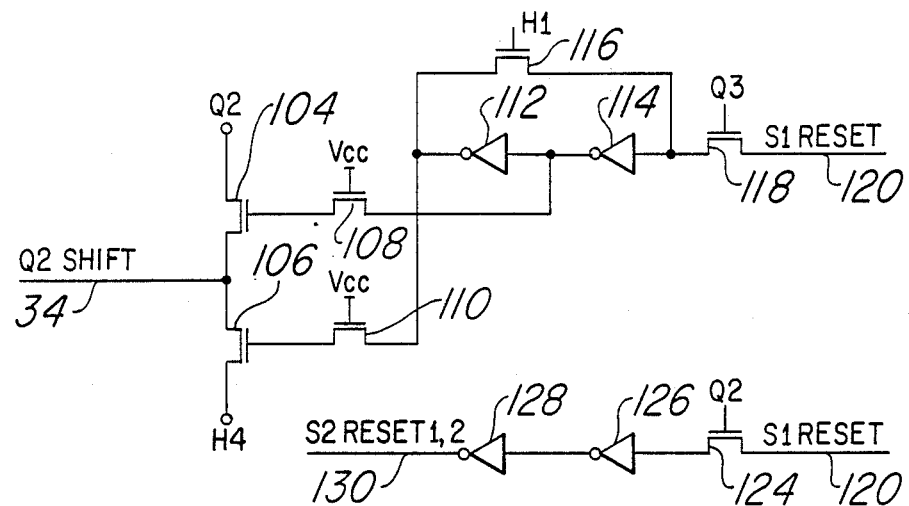
FIG. 3 is a circuit diagram of a clock circuit used to generate the shift register clock signal Q2SHIFT and reset signals S2REST1,2.

The shift circuit used to generate Q2SHIFT is shown in FIG. 3 as consisting of a pair of transistors 104 and 106 whose source to drain paths are connected to Q2SHIFT line 34 at one end and to Q2 and H4, respectively, at the other end. The gates of transistors 104 and 106 are both fed past gates 108 and 110 gated on by Vcc from the output of inverters 114 and 112, respectively. Reset signal S1RESET on line 120 passes on Q3 through transistor 118 into inverters 114 and 112. During H1 the output of inverter 112 is fed back to the input of inverter 114 to refresh the latter. With a normally low S1RESET signal on line 120 transistor 104 will be gated on and transistor 106 will be gated off. When S1RESET goes high transistor 104 goes off and transistor 106 comes on thereby passing H4 onto Q2SHIFT line 34. Thus, on the machine cycle following S1RESET, a Q2SHIFT signal will occur during H4 and not Q2.

The sequencing circuit used to generate refresh signals H4LOAD1 and H4LOAD2 is seen in FIG. 4. The value of the signal level at junction 132 is fed through inverter 134 to arrive at junction 138 which is applied to the gate of transistor 148 and to the gate of transistor 146 after passing through transistor 143 which is gated on by Vcc. The signal at junction 138 also passes through inverter 136 to arrive at junction 140. The voltage at junction 140 is applied to the gate of transistor 150 and after passing through transistor 142, which is gated on by Vcc, and to the gate of transistor 144. On clock signal H4, the voltage at junction 140 which is the same as that at junction 132 passes through inverter 162. When a Q2END64 signal is received on line 59, the inverted signal out of inverter 162 is applied to junction 132 changing the voltage at the latter junction. The reversal in voltage on junction 132 results in a change from one of H4LOAD1 and H4LOAD2 to the other. Thus, one of H4LOAD1 and H4LOAD2 is generated for an entire pass through the shift register until a Q2END64 signal is generated after a logic "1" has passed out of the last stage of the shift register 43.

In the absence of a Q2END64 signal the voltage level at junction 140 is refreshed every cycle by H4 gating on transistor 166. The entire circuit is reset by S1RESET gating on transistor 130 and grounding junction 132 thereby causing H4LOAD2 to be placed on line 158. Transistors 152 and 154 ground the output lines 156 and 158 on every H2.

In the event of a S2RESET1,2 signal being generated line 59 is grounded and NOR gate 14 generates a zero. The generation of S2RESET1,2 which has been initiated by S1RESET is also accompanied by an additional Q2SHIFT signal during H4. Thus, any ones in the shift register are transmitted right through and each stage is zeroed since all pass gates are gated on simultaneously by Q2SHIFT and H4 going high at the same time.

It will be obvious that there are several possible circuits that may be devised to generate the above clock signals an to implement the refresh method. One could also devise circuitry to reduce the size of the shift register even more and cycle through the rows using an even greater number of cycles through the shift register. For example, it is possible to use a 32 bit shift register for 128 rows and cycle through the shift register 4 times rather than two utilizing four H4LOAD1,2 lines rather than just two.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An array of dynamic memory cells that must be refreshed at regular intervals to maintain the information, in the form of an electrical signal, stored in each cell, the cells being accessed by a machine to perform read and write accesses on the information contained in the cells, the machine operating in cycles with a read or write access occurring once during a machine cycle, each machine cycle including four equal duration clock cycles, and a read and a write access refreshing the accessed cells, said array comprising:

A. plural dynamic memory cells arranged in rows and columns;
B. plural row lines each electrically connecting together the memory cells in each row;
C. plural pairs of column lines, each pair electrically connecting together the memory cells in each column;
D. precharging circuits connected to each pair of column lines that precharge the column lines of the array once every machine cycle in preparation for a read or write access to said cells, each precharging circuit receiving a timing signal to start normal precharging during the first clock cycle of each machine cycle and the charge remaining on said column lines until an access of the cells;
E. a row address decoder connected to all said row lines to activate one row line during the third and fourth clock cycles of a machine cycle for each read and write access of the cells;
F. a shift register connected to said row lines between said row address decoder and said cells, said shift register including sequential stages with each stage being connected to at least one row line, each stage including a shift circuit that passes a bit of one sense through the stage from a previous stage to the next stage upon receipt of a shift signal, a driver circuit capable of activating a row line upon said bit of one sense being in said stage and a gating circuit that applies the driver circuit to said row line upon receipt of a refresh signal; and
G. a timing circuit coupled to said four clock cycles and producing said refresh signal and refreshes said dynamic memory cells at least partially during said precharging of said column lines before said row address decoder activates a row line, and also producing said shift signal between producing a refresh signal.

2. The array of claim 1 in which each shift register stage includes plural bit positions each connected to a row line and each gating circuit is connected to the row lines connected to the bit positions, each bit position including a partial shift circuit that passes said bit of one sense through the bit position from a previous bit position to the next bit position upon receipt of a shift signal.

3. The array of claim 2 in which said timing circuit produces plural refresh signals that are connected to said gating circuit to gate said driver circuit to selected ones of said plural row lines.

4. The array of claim 3 in which each stage includes two bit positions and said gating circuit connects to two row lines, said timing circuit produces two refresh signals with each refresh signal being active in sequence after said bit of one sense cycles completely through said shift register, and said two refresh signals gating said driver circuit to alternating row lines.

5. The array of claim 3 in which each stage includes an integer number N of bit positions and said gating circuit connects to N number of row lines, said timing circuit produces N refresh signals with each refresh signal being active in sequence after said bit of one sense cycles completely through said shift register, and said N refresh signal gating said driver circuit to sequential ones of said N row lines.

6. The array of claim 5 in which said number N is 2.

7. The array of claim 3 including plural blocking gates, each connected to a row line between said address decoder and said cells, each refresh signal alternating in connection between one blocking gate and one gating circuit and an active refresh signal blocking any active signal to the row lines to which it is connected.

8. The array of claim 1 in which each said cell includes four transistors, two of which are cross connected into a latch and the other two having gates connected to a row line and having sources and drains connecting the latch to said column lines.

9. The array of claim 1 including row clock signals coupling activated row lines to said cells.

10. The array of claim 7 in which said blocking gate connects said row line to circuit ground.

11. The array of claim 3 in which said timing circuit includes a sequencing circuit for producing each refresh signal in sequence.

12. The array of claim 11 in which said sequencing circuit switches from one refresh signal to the next upon said bit of one sense passing from a last stage to a first stage of said shift register.

13. An array of dynamic memory cells that must be refreshed at regular intervals, said array comprising:
  A. plural dynamic memory cells connected together by row lines and by column lines;
  B. plural precharge circuits connected to said column lines and regularly precharging said column lines;
  C. an access circuit connected to each row line and producing an access pulse on one row line in response to a refresh signal; and
  D. a timing circuit that produces said refresh signal and refreshes said dynamic memory cells during said precharging said column lines.

14. The array of claim 13 in which said access circuits produce access pulses to all of said row lines within said interval.

15. The array of claim 13 in which said timing circuit includes a sequencing circuit that produces sequential plural refresh signals, alternating ones of said access circuits are grouped together and one refresh signal connects to each group of access circuits.

16. The array of claim 15 in which said sequencing circuit produces one refresh signal for all of the access circuits in one group before producing the next refresh signal.

17. The array of claim 16 including an address decoder connected to all of the row lines and producing an access pulse on each row line in response to a received address, said access circuits being connected to said row lines between said address decoder and said cells, each access circuit including a blocking gate connected to a row line and the blocking gates of each group of access circuits being connected to the refresh signal connected to another group of access circuits.

18. The array of claim 16 in which there are two groups of said access circuits and there are two refresh signals.

19. The array of claim 13 in which each said access circuit includes a shift register portion that shifts a bit of one sense from one access circuit to the next, said timing circuit produces a refresh signal to all of the access circuits at the same time, and each access circuit also includes a gating circuit that senses the presence of said bit and said refresh signal to produce an access pulse on one row line at a time.

20. The array of claim 19 in which said timing circuit includes a shift circuit producing a shift signal connected to said shift register portions to shift said bit from one access circuit to the next.

21. The array of claim 19 in which each access circuit includes a driver circuit sensing the presence of said bit and said gating circuit gates the output of said driver circuit to said row line.

22. The array of claim 13 in which each said cell includes four transistors, two of which are cross connected into a latch and the other two having gates connected to a row line and having sources and drains connecting the latch to said column lines.

23. The array of claim 13 including row clock signals coupling activated row lines to said cells.

24. A process of refreshing an array of dynamic memory cells that must be refreshed at regular intervals to maintain the information, in the form of an electrical signal, stored in each cell, the cells being arranged in rows and columns and connected together by row and column lines, there being a machine that operates in cycles to read from and write to the cells of the array with a read or write of the array occurring once during a machine cycle, each machine cycle including four equal duration clock cycles, said process comprising;
  A. accessing the cells a row at a time with said machine through a row address decoder connected to all of the row lines to perform read and write accesses on the information contained in the cells, each access of the array activating a row line that refreshes the accessed cells connected to that row line and occurring during said third and fourth clock cycles of the machine cycles;
  B. precharging the column lines of the array once every machine cycle before accessing said cells, each precharging starting during the first clock cycle of each machine cycle and the charge remaining on said column lines until said accessing of the cells;
  C. shifting a bit of one sense through a shift register connected to said row lines between said row address decoder and said cells, said shifting including shifting said bit through sequential stages of said shift register upon receipt of a shift signal with each stage being connected to at least one row line;
  D. producing a drive signal capable of activating a selected row line upon said bit of one sense being in a corresponding stage;
  E. gating said drive signal to said row line upon receipt of a refresh signal; and
  F. producing said refresh signal and refreshes said dynamic memory cells at least partially during said precharging of said column lines and before said accessing the cells.

25. The process of claim 24 in which said shifting includes shifting said bit through plural bit positions of each stage with each bit position being connected to one row line, said gating includes gating said drive signal to one of said row lines, and said shifting includes shifting said bit upon receipt of a shift signal.

26. The process of claim 25 in which said producing includes producing plural refresh signals, and said gating including gating said driver signal to selected ones of said plural row lines in response to each refresh signal.

27. The process of claim 26 in which said shifting includes shifting said bit through two bit positions, said gating includes gating said drive signal to one of two row lines, said producing includes producing two refresh signals, and said producing includes sequencing said two refresh signals to be active in sequence after said shifting shifts said bit of one sense completely through said shift register.

28. The process of claim 26 in which said shifting includes shifting said bit through an integer number N of bit positions, said gating includes gating said drive signal to one of N row lines, said producing includes producing N refresh signals, and said producing includes sequencing said N refresh signals to be active in sequence after said shifting shifts said bit of one sense completely through said shift register.

29. The process of claim 28 in which said number N is 2.

30. The process of claim 26 including blocking activation of said row lines by said row address decoder upon receipt of a refresh signal.

31. The process of claim 24 including furnishing each said cell with four transistors, two of which are cross connected into a latch and the other two having gates connected to a row line and having sources and drains connecting the latch to said column lines.

32. The process of claim 24 including coupling activated row lines to said cells with row clock signals.

33. The process of claim 30 in which said blocking includes connecting said row line to circuit ground.

34. The process of claim 26 in which said producing includes sequencing said refresh signals to produce each refresh signal in sequence.

35. The process of claim 34 in which said sequencing switches from producing one refresh signal to the next upon said shifting said bit of one sense from a last stage to a first stage of said shift register.

36. A process of refreshing an array of dynamic memory cells that must be refreshed at regular intervals, said process comprising:
   A. connecting together plural dynamic memory cells with row lines and column lines;
   B. regularly precharging said column lines;
   C. producing an access pulse on one row line in response to a refresh signal; and
   D. generating said refresh signal and refreshes said dynamic memory cells during said precharging said column lines.

37. The process of claim 36 in which said producing includes producing access pulses to all of said row lines within said interval.

38. The process of claim 36 including grouping together alternating ones of said row lines, said generating includes generating sequential plural refresh signals, and further including connecting one refresh signal to each group of row lines.

39. The process of claim 38 in which said generating includes generating one refresh signal for all of the row lines in one group before generating the next refresh signal.

40. The process of claim 39 including effecting an access pulse on each row line in response to a received address, and blocking an access pulse on a row line of each group during a refresh signal connected to another group of row lines.

41. The process of claim 38 in which said grouping includes forming two groups and said generating includes generating two refresh signals.

42. The process of claim 36 in which said producing includes shifting a bit of one sense from one shift register stage to the next, said shift register stages being connected to said row lines, said generating includes generating a refresh signal to all of the shift register stages at the same time, and further including gating an access pulse on one row line at a time in the presence of said bit and said refresh signal at one shift register stage.

43. The process of claim 42 in which said generating includes generating a shift signal, and said shifting includes shifting said bit from one stage to the next.

44. The process of claim 42 in which said producing includes producing a driver signal in the presence of said bit and said gating includes gating said driver signal to said row line.

45. The process of claim 36 in which said connecting includes connecting together cells of four transistors, two of which are cross connected into a latch and the other two having gates connected to a row line and having sources and drains connecting the latch to said column lines.

46. The process of claim 36 including coupling activated row lines to said cells with row clock signals.

* * * * *